(12) United States Patent
Denda et al.

(10) Patent No.: US 6,447,691 B1
(45) Date of Patent: Sep. 10, 2002

(54) METHOD FOR DETECTING END POINT OF PLASMA ETCHING, AND PLASMA ETCHING APPARATUS

(75) Inventors: Atsushi Denda; Yoshinao Ito, both of Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/287,611

(22) Filed: Apr. 7, 1999

(30) Foreign Application Priority Data

Apr. 7, 1998 (JP) .......................................... 10-094931
Jul. 10, 1998 (JP) .......................................... 10-211833

(51) Int. Cl.$^7$ ......................................... H01L 21/3065
(52) U.S. Cl. ............................ 216/61; 438/10; 156/345
(58) Field of Search ..................... 156/345; 204/298.32, 204/192.33; 315/111.21; 216/60, 61; 438/9, 10, 17

(56) References Cited

U.S. PATENT DOCUMENTS

| 4,207,137 A | 6/1980 | Tretola ........................ 156/627 |
| 4,358,338 A | 11/1982 | Downey et al. ............. 156/627 |
| 4,602,981 A | 7/1986 | Chen et al. .................. 156/627 |
| 5,228,939 A | 7/1993 | Chu ............................ 156/345 |
| 5,273,610 A | 12/1993 | Thomas, III et al. ........ 156/345 |
| 5,330,615 A | 7/1994 | Chu ............................ 156/643 |
| 5,472,561 A | 12/1995 | Williams et al. .......... 156/627.1 |
| 5,556,549 A | 9/1996 | Patrick et al. ................ 216/61 |
| 5,565,737 A | 10/1996 | Keane .................... 315/111.21 |
| 5,576,629 A | 11/1996 | Turner et al. ................ 324/709 |
| 5,910,011 A | * 6/1999 | Cruse ........................... 438/16 |
| 5,939,886 A | * 8/1999 | Turner et al. ........... 315/111.21 |
| 5,971,591 A | * 10/1999 | Vona et al. ............. 364/478.08 |

FOREIGN PATENT DOCUMENTS

JP  5-28895  4/1993

\* cited by examiner

*Primary Examiner*—Thi Dang
(74) *Attorney, Agent, or Firm*—Konrad Raynes Victor & Mann LLP; Alan S. Raynes (57) ABSTRACT

Certain embodiments provide a plasma etching apparatus and a method for detecting the end point of plasma etching, which can more accurately detect the end point of plasma etching. A radiofrequency wave generated in a radiofrequency generating system 5 propagates through a lead line 30 and is applied to a cathode 9 in a plasma chamber 1. Plasma 11 thereby is generated in the plasma chamber and selectively etches a semiconductor wafer 12. A RF probe 8 measures the voltage and current of the radiofrequency wave flowing in the lead line 30. A determination system 15 may determine the end point of the plasma etching on the basis of either the voltage or current, whichever changes first.

15 Claims, 5 Drawing Sheets

METHOD FOR DETECTING END POINT OF PLASMA ETCHING, AND PLASMA ETCHING APPARATUS

TECHNICAL FIELD

The present invention relates to methods for detecting the end point of plasma etching and to plasma etching devices which are applicable to, for example, production of semiconductor devices.

RELATED ART

Plasma etching may be used during the production of semiconductor devices. During plasma etching, the end point is typically detected by emission spectra of plasma. The method for detecting the end point of etching is an application of emission spectroanalysis of the plasma state during the etching operation. Plasma emission is a phenomenon caused by active gas species in the plasma, and studies on the plasma emission have been developed as plasma diagnostic technologies in spectroanalysis. The plasma emission spectra depend on the reactive gas and reaction products in the plasma, hence observation of a change over time in the intensity of a specified wavelength, i.e., the intensity of a specified substance in the plasma, indicates a change in the amount of the reaction products or the active species during the etching.

A general method for actually detecting the end point includes monitoring a change in the intensity of the plasma emission with respect to a specified wavelength through an interference filter or a monochromator, and detecting the end point of the plasma etching by data processing. This method, however, has the following problems: (1) Deterioration of the plasma light receiving window causes a decrease in transmittance of the plasma emission and affects the end point detection. (2) Fluctuation of emission due to unstable plasma significantly affects the end point detection. (3) When the area of the patterning face of the film subjected to plasma etching is significantly small, (that is, in plasma etching of contact holes and via-holes in semiconductor devices), a change in the emission intensity is extremely low; hence the end point is not detected. (4) When etching a new material, a specific wavelength having a change which will allow end point detection must be found. Such a specific wavelength may be not found in some cases.

Japanese Patent Publication No. 5-28895 (and U.S. Pat. No. 4,602,981) discloses another method for detecting the end point which may solve some of the problems of spectroanalysis of the plasma emission. In this technology, the end point is detected by measuring the radiofrequency voltage (RF) of the electrode in the plasma etching apparatus and by detecting the change (if any) in the RF voltage.

SUMMARY

One embodiment of the present invention relates to a plasma etching apparatus using a radiofrequency wave. The apparatus includes a radiofrequency generating means for generating the radiofrequency wave and an electrode provided at a position for generating a plasma. The apparatus also includes a radiofrequency propagation means for propagating the radiofrequency wave generated in the radiofrequency generating means. A radiofrequency voltage measuring means is provided in the radiofrequency propagation means for measuring the voltage of the radiofrequency wave propagating through the radiofrequency propagation means. A radiofrequency current measuring means is also provided in the radiofrequency propagation means for measuring the current of the radiofrequency wave propagating through the radiofrequency propagation means. A determination means is provided for determining the end point of the plasma etching on the basis of the voltage and the current.

Another embodiment relates to a method for detecting the end point of plasma etching using a radiofrequency wave. The method includes measuring a voltage and a current of the radiofrequency wave, and then determining the end point of the plasma etching on the basis of the voltage and the current.

In one aspect of certain embodiments, an end point of an plasma etching operation is found by determining the first to change of the voltage and the current.

Still another embodiment relates to a plasma etching apparatus including an RF generator and a plasma formation region between an anode and a cathode. The apparatus also includes a voltage measurement device and a current measurement device.

Yet another embodiment relates to a method for monitoring a plasma etching operation, including monitoring a voltage of an RF signal and monitoring a current of the RF signal. The method also includes determining when a voltage change occurs and determining when a current change occurs.

BRIEF DESCRIPTION OF THE DRAWINGS

Embodiments of the invention are described with reference to the accompanying drawings which, for illustrative purposes, are schematic and not drawn to scale.

DETAILED DESCRIPTION

Certain embodiments of the present invention provide devices for plasma etching and methods for detecting the end point of plasma etching which permit one to reliably detecting the end point of the plasma etching. When attempting to determine the endpoint of an etching operation using a method such as measuring the RF voltage, it is possible that in some workpieces to be etched, the voltage of the radiofrequency wave does not change (or is very small) at the completion of etching or that the change in the voltage is delayed with respect to the completion of the etching. When such workpieces are etched, detecting the completion of etching by measuring the RF voltage cannot accurately detect the end point of the etching.

The endpoint of etching may also be measured by a change in RF current. When making such a current measurement using a conventional RF probe, impedance of the probe itself will directly affect the detection environment and can cause the following problems. (1) The RF probe is heated. Thus, the measured RF current varies before and after heating. (2) The plasma discharging state varies when the RF probe is attached or detached. Thus, stabilized plasma etching is not performed. (3) Since the RF probe is heated, the RF probe may combust when the etching apparatus is used for a long time.

A plasma etching apparatus using a radiofrequency wave in accordance with embodiments of the present invention comprises a radiofrequency generating means for generating the radiofrequency wave, an electrode provided at a position for generating a plasma, a radiofrequency propagation means for propagating the radiofrequency waves generated in the radiofrequency generating means, a radiofrequency voltage measuring means provided in the radiofrequency propagation means for measuring the voltage of the radiofrequency wave propagating through the radiofrequency propagation means, a radiofrequency current measuring means provided in the radiofrequency propagation means for measuring the current of the radiofrequency wave propagating through the radiofrequency propagation means, and a determination means for determining the end point of the plasma etching on the basis of the voltage and the current.

The plasma etching apparatus in accordance with certain embodiments measures the voltage of the radiofrequency wave propagating through the radiofrequency propagation means using the radiofrequency voltage measuring means, and measures the current of the radiofrequency wave propagating through the radiofrequency propagation means using the radiofrequency current measuring means. The determination means determines the end point of the plasma etching on the basis of the voltage and the current of the radiofrequency wave. This apparatus can reliably determine the end point of the etching, compared to a conventional apparatus which determines the end point of the etching only by the change in the voltage of the radiofrequency waves. Herein, the change in the voltage and the current of the radiofrequency wave indicates an initial point, an intermediate point and an end point of the change. The change can be determined in view of properties of the workpiece to be etched. In certain embodiments the determination means preferably determines the end point of the plasma etching on the basis of either the voltage or the current, whichever changes first.

In addition, in certain embodiments, an electric device between measuring means, including the radiofrequency voltage measuring means and the radiofrequency current measuring means, and the electrode, preferably consists of only the radiofrequency propagation means. When a radiofrequency matching network or a blocking capacitor is provided between the electrode and the measuring means, accuracy of measurement of a change in the voltage and the current of the radiofrequency wave is decreased. Thus, in certain embodiments any electric device may be present between the electrode and the measuring means, as long as the accuracy of the measurement of a change in the voltage and the current of the radiofrequency wave is not decreased.

Preferably, the radiofrequency current measuring means measures a current flowing in a coil wound around the radiofrequency propagation means. Since the current flowing in the radiofrequency propagation means does not directly flow in the radiofrequency current measuring means, the apparatus does not cause heating of the radiofrequency current measuring means or a change in impedance of the plasma.

It is preferable that in certain embodiments an additional determination means for determining the end point of the plasma etching be provided and the end point of the plasma etching be determined on the basis of: (1) data from the determination means using voltage and current measurements; and (2) data from the additional determination means. By providing the additional means, data for detecting the end point of the etching is increased. Thus, the end point of the etching can be more precisely detected. The result of the comparison of the monitoring data from the determination means using the voltage and current measurements and the other additional determination means are compared with a predetermined standard which is previously set. By determining that monitoring data outside of the predetermined standard range is an abnormal value, abnormalities during etching can be detected in real time.

Examples of conventional determination means for determining the end point of plasma etching which could be used as additional determination means include (1) measuring a thickness using interference of reflected light when a workpiece is irradiated with a He—Ne laser beam, (2) identifying the etched substance from masses of molecules in a plasma chamber using a mass spectrometer, and (3) detecting plasma emission spectrum.

Other embodiments include a method for detecting the end point of plasma etching using a radiofrequency wave comprises measuring a voltage and a current of the radiofrequency wave and determines the end point of the plasma etching on the basis of the voltage and the current. Thus, this method can more accurately determine the end point of the etching than a method for determining the end point of the etching only by a change in the voltage of the radiofrequency wave. Preferably, the voltage and the current of the radiofrequency wave are measured and the end point of the plasma etching is determined on the basis of either the voltage or the current, whichever changes first.

Several preferred embodiments of devices and methods will be described in detail with reference to the attached drawings.

Figure 1:
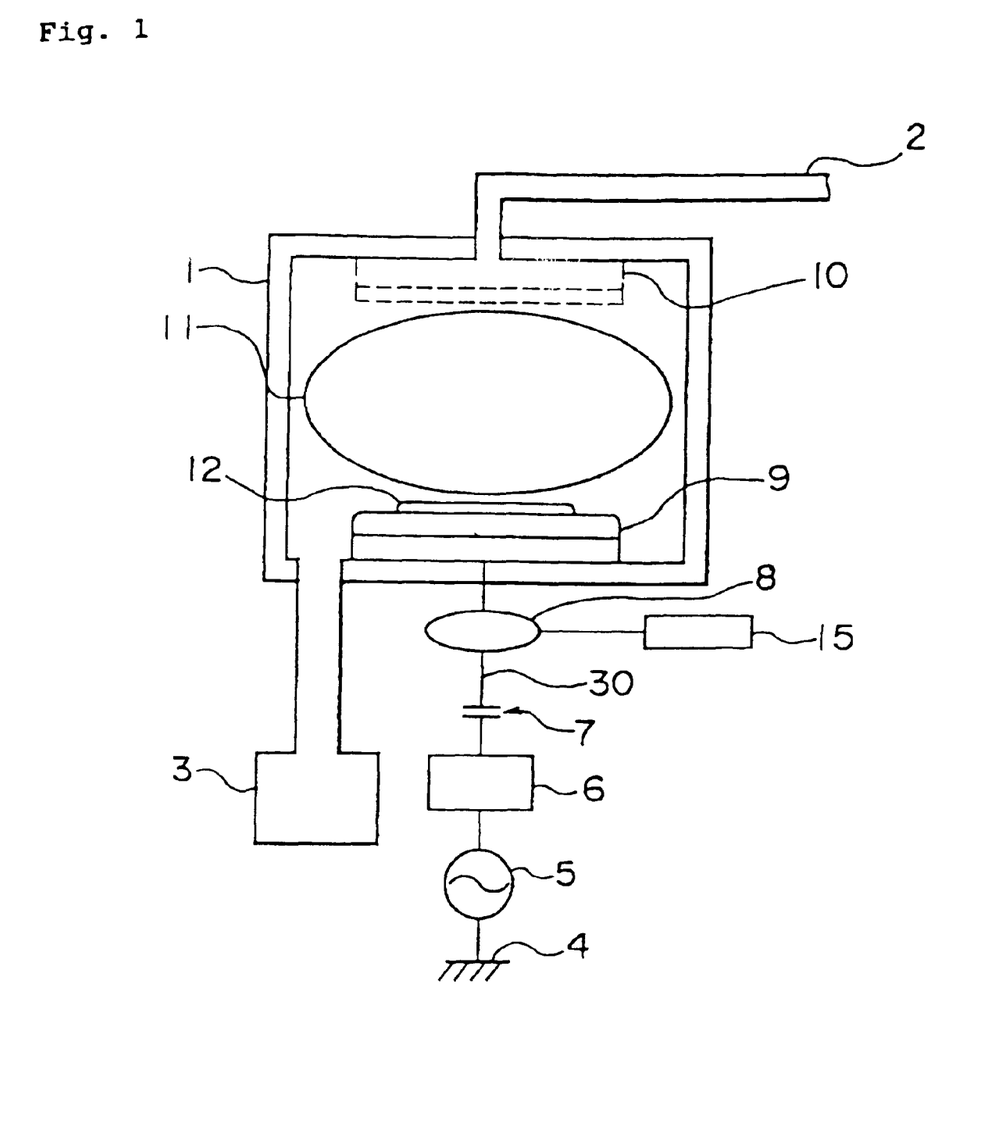
FIG. 1 is a schematic view of a first embodiment of a plasma etching apparatus in accordance with the present invention.

FIG. 1 is a schematic view of a first embodiment of a plasma etching apparatus in accordance with the present invention. The etching apparatus is a diode parallel plate RIE plasma etching system. Reactive gas is introduced into a plasma chamber 1 from a reactive gas inlet pipe 2. A vacuum pumping system 3 maintains the plasma chamber 1 to a desired pressure. The plasma chamber 1 is provided with an anode 10 at the top section and a cathode 9 at the bottom section. A semiconductor wafer 12 as a workpiece to be etched is placed on the cathode 9. The radiofrequency wave generated in a radiofrequency generating system 5 connected to a ground 4 propagates through a radiofrequency matching network 6, a blocking capacitor 7, a RF probe 8, and the cathode 9, in that order, to generate plasma 11 between the cathode 9 and the anode 10 in the plasma chamber 1. The electric devices may be connected in series by a lead line 30 as an example of radiofrequency propagation means.

The RF probe 8 is an example of measuring means including a radiofrequency voltage measuring means and a radiofrequency current measuring means. The electrical device between the cathode 9 and the RF probe 8 preferably includes only the lead line 30. The RF probe 8 is electrically connected to a determination system 15. The determination system 15 is an example of a determination means, and in certain embodiments determines the end point of the plasma etching on the basis of either the voltage or the current of the radiofrequency wave measured by the RF probe 8, whichever changes first.

Figure 2:
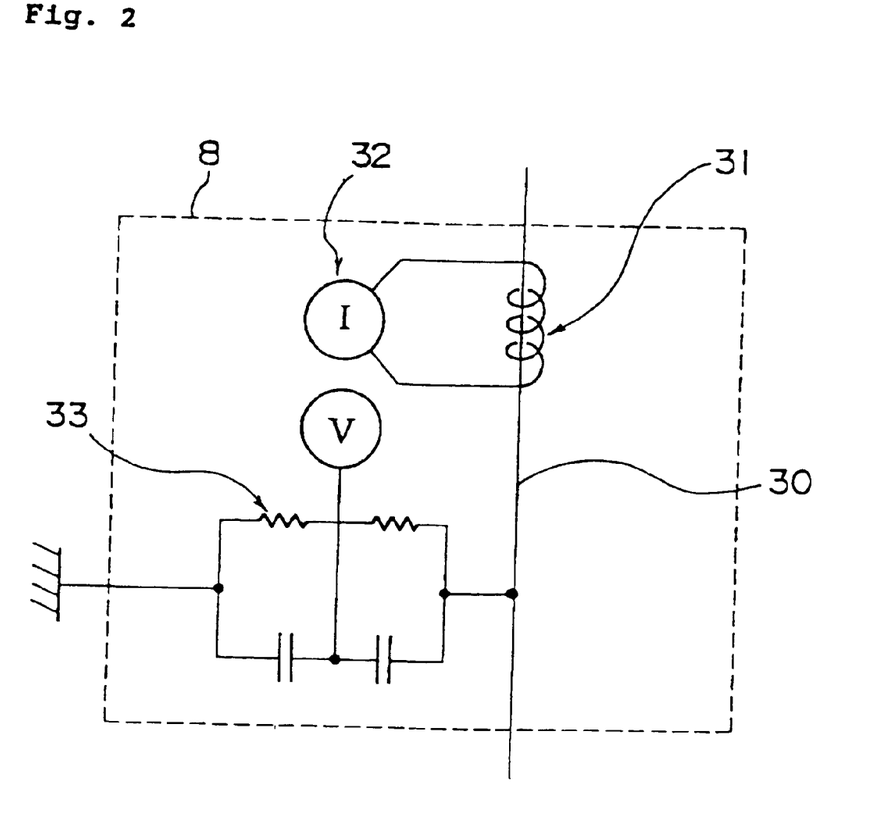
FIG. 2 is a circuit diagram of a RF probe usable in the present invention.

FIG. 2 is an electrical circuit diagram of one embodiment of the RF probe 8. A coil 31 is wound around the lead line 30 and is connected to an ammeter. The ammeter and the coil 31 constitute a current measuring system 32. The current measuring system 32 is an example of a radiofrequency current measuring means. The lead line 30 is connected to a circuit including resisters and capacitors. This circuit and a voltmeter constitute a voltage measuring system 33. The voltage measuring system 33 is an example of a radiofrequency voltage measuring means.

Figure 3:
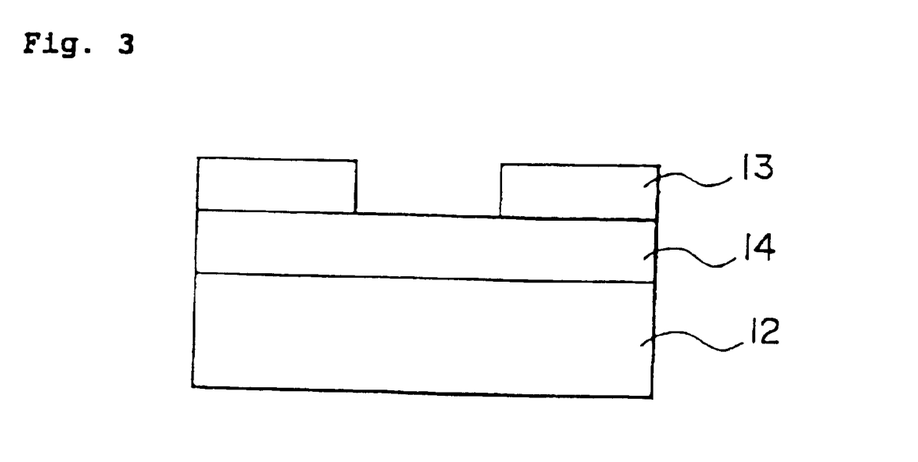
FIG. 3 is a cross-sectional view of a semiconductor wafer subjected to plasma etching according to an embodiment of the present invention.

FIG. 3 is a cross-sectional view of a semiconductor wafer 12. A silicon oxide film 14 was formed on the semiconductor wafer 12, and a selectively exposed photoresist film 13 was formed on the silicon oxide film 14 as a mask. The semiconductor wafer 12 was placed on the cathode 9 shown in FIG. 1, and the silicon oxide film 14 was plasma-etched through the photoresist film 13. The etching conditions were as follows. $C_2F_6$ and He were used as reactive gases at flow rates of 30 sccm and 50 sccm, respectively. The pressure in the etching chamber 1 was 2 Torr and the electrical power of the radiofrequency wave was 600 W.

Figure 4:
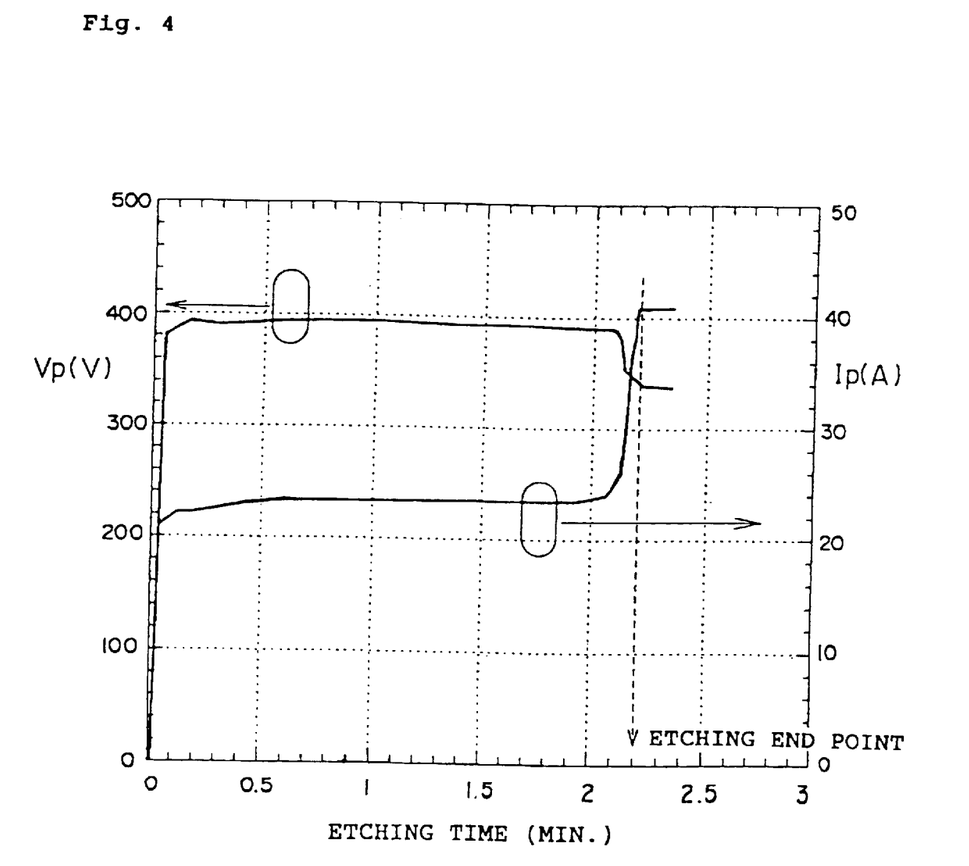
FIG. 4 is a graph showing changes in the voltage and current over time of a radiofrequency wave according to an embodiment of the present invention.

The voltage Vp and the current Ip of the radiofrequency wave during the plasma etching were measured by the RF probe 8. FIG. 4 shows changes thereof over time. The voltage Vp and the current Ip increase after applying the radiofrequency wave electrical power and reaches approximately 400 V and 22 A, respectively. After this, the voltage Vp and the current Ip are substantially constant until the etching is completed. After completion of plasma etching of the silicon oxide film 14, the voltage Vp decreases to approximately 350 V, whereas the current Ip increases to approximately 40 A.

During the plasma etching, signals of the voltage Vp and the current Ip are sent to the determination system 15 shown in FIG. 1. The determination system 15 may, in certain embodiments, determine the end point of the plasma etching on the basis of either the voltage Vp or the current Ip, whichever changes first. In this plasma etching, the voltage Vp and the current Ip substantially changed simultaneously.

Accordingly, because the first embodiment determines the end point of the plasma etching on the basis of changes in the voltage and the current of the radiofrequency wave, it can more consistently determine an accurate end point of the etching than an apparatus determining the end point of the plasma etching only by a change in the voltage of the radiofrequency wave.

Figure 5:
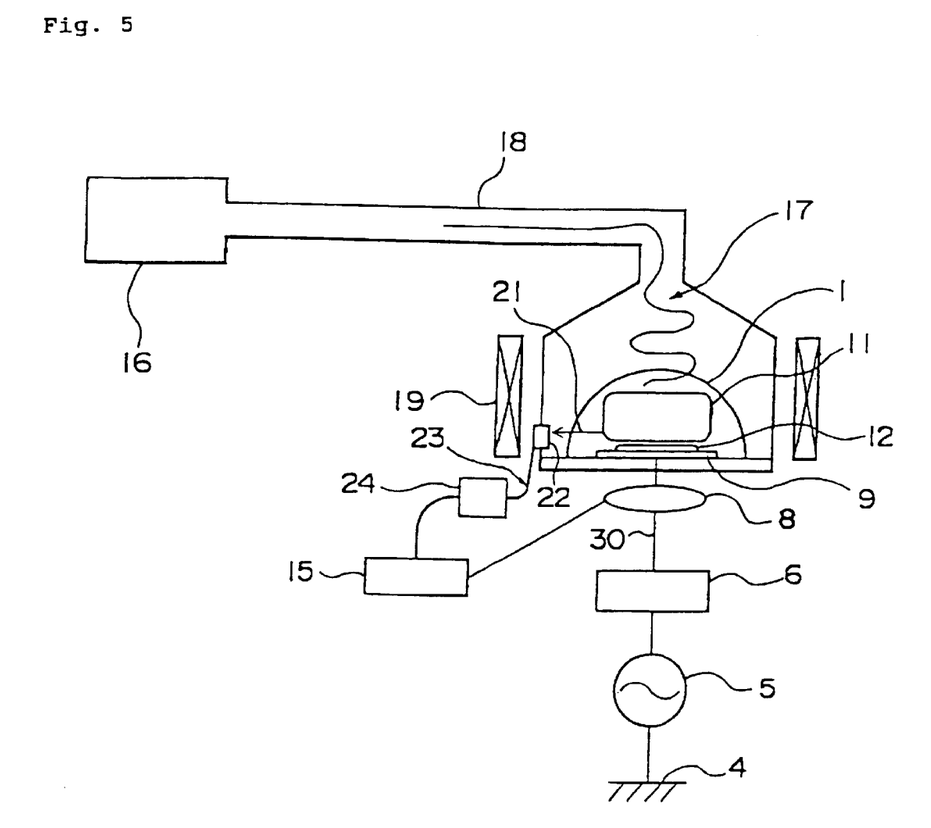
FIG. 5 is a schematic view of a second embodiment of a plasma etching apparatus in accordance with the present invention.

FIG. 5 is a schematic view of a second embodiment of a plasma etching apparatus in accordance with the present invention. This embodiment includes an ECR plasma etching system. Reactive gas is introduced into a plasma chamber 1 from a reactive gas inlet pipe. The plasma chamber 1 is maintained at a desired pressure by a vacuum pumping system.

A radiofrequency wave 17 generated in a magnetron 16 propagates through a waveguide 18 and causes ECR resonance in a magnetic field generated by an electromagnetic coil 19. Plasma 11 is thereby generated in the plasma chamber 1.

On the other hand, a radiofrequency wave generated in a radiofrequency generating system 5 connected to a ground 4 propagates through a radiofrequency matching network 6, a RF probe 8, and a cathode 9, in that order, and then controls the state of the plasma 11 near the semiconductor wafer 12 to be etched which is placed on the cathode 9. These electrical devices are connected in series by a lead line 30 as an example of radiofrequency propagation means.

The RF probe 8 is an example of a measuring means including the radiofrequency voltage measuring means and the radiofrequency current measuring means, and the configuration thereof may be the same as the RF probe 8 shown in the first embodiment. The RF probe 8 is electrically connected to a determination system 15 as an example of a determination means.

In the second embodiment, there is provided an end-point detection mechanism of etching by plasma emission spectrometry, which is an example of an additional detecting method for determining the etching end point. Plasma light 21 generated in the plasma chamber 1 enters a monochromator 24 via a plasma light receiving window 22 and an optical fiber 23, and the monochromator 24 sends emission intensity signals of a required wavelength to the determination system 15. Thus, the determination system 15 is also an example of an additional determination means.

Figure 6:
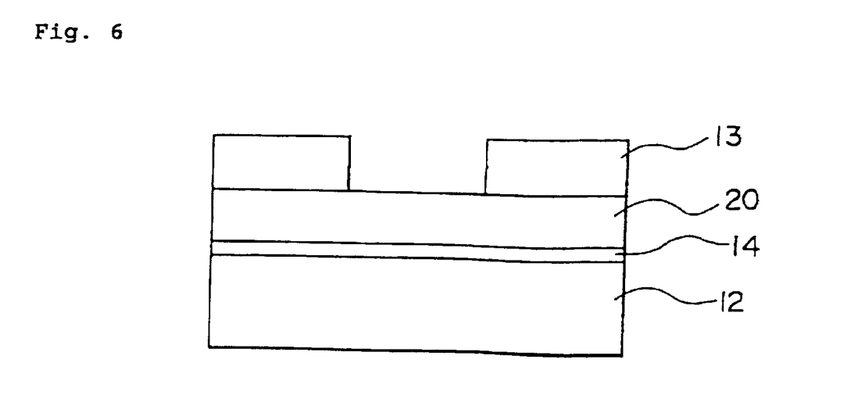
FIG. 6 is a cross-sectional view of a semiconductor wafer subjected to plasma etching according to an embodiment of the present invention.

FIG. 6 is a cross-sectional view of the semiconductor wafer 12. A silicon oxide film 14, a polysilicon film 20 and a resist 13 were formed on the semiconductor wafer 12, in that order. The resist 13 was selectively exposed. The semiconductor wafer 12 is placed on the cathode 9 shown in FIG. 5, and the polysilicon film 20 was selectively etched to expose the underlying silicon oxide film 14. The etching conditions were as follows. $SF_6$ and $C_2HCl_2F_3$ were used as reactive gases at flow rates of 30 sccm and 60 sccm, respectively. The pressure in the etching chamber 1 was 10 mTorr and the electrical power of the radiofrequency wave was 10 W.

Figure 7:
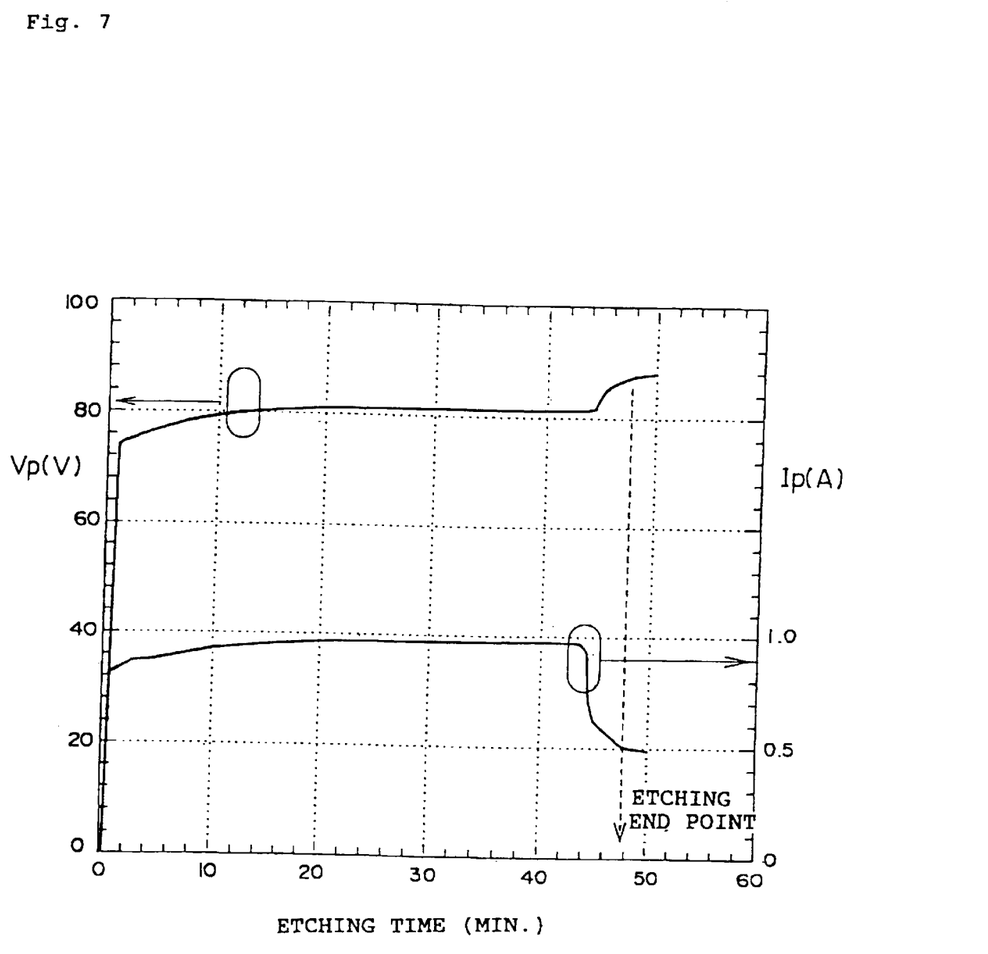
FIG. 7 is a graph showing changes in the voltage and current over time of a radiofrequency wave according to an embodiment of the present invention.

The voltage Vp and the current Ip of the radiofrequency wave during the plasma etching were measured by the RF probe 8. FIG. 7 shows the changes thereof over time. The voltage Vp and the current Ip increase after applying the radiofrequency wave electrical power and reach approximately 80 V and 1 A, respectively. After this, the voltage Vp and the current Ip are substantially constant before the plasma etching of the polysilicon film 20 is completed. After completion of the plasma etching of the polysilicon film 20, the voltage Vp increases to approximately 90 V whereas the current Ip decreases to approximately 0.5 A. Signals of the voltage Vp and the current Ip are sent to the determination system 15 shown in FIG. 5, as occasion demands, and the determination system 15 determines which changes first. In this plasma etching, the voltage Vp and the current Ip substantially changed simultaneously. This data is compared with the data of a change in emission intensity signals of a required wavelength by the conventional emission spectrometry, and the end point of the plasma etching was determined on the basis of that first changed.

Since the second embodiment uses the data of a change in emission intensity signals of a required wavelength by the conventional emission spectrometry, as the data for determining the end point of the plasma etching, in addition to the voltage and the current of the radiofrequency wave, the end point of the etching can be more accurately determined compared with the first embodiment. Any other method for determining the end point of etching may be employed instead of the emission spectrometry and data obtained by this other method may be used instead of the data obtained by emission spectrometry.

Although the voltage and current of the radiofrequency wave substantially simultaneously change in the first and second embodiments, a change in the voltage of the radiofrequency wave may not occur or may be delayed for some workpieces to be etched when etching is completed. Thus, the present invention using a change in the current of a radiofrequency wave, in addition to a change in the voltage of the radiofrequency wave, as data for determining the end point of etching can more accurately determine the end point of the etching than conventional detecting methods of the etching end point.

Furthermore, in the first and second embodiments, although the end point of plasma etching may be determined on the basis of either the voltage or the current of the radiofrequency wave which changes first, it may also be determined on the basis of changes which occur later to prevent erroneous determination caused by noise. What changes first may be a change affected by noise. Therefore, in certain cases, the end point of plasma etching may be determined by a change in the current when the voltage changes first or by a change in the voltage when the current changes first.

Embodiments of the present invention may be applied to a variety of plasma etching operations in which an RF signal is used to supply energy to a chamber to generate and/or control the plasma. In certain embodiments the output of a generator is coupled to the chamber through a conduit which permits the monitoring of both voltage and current, so that variations in the plasma can be determined from changes in the voltage and/or current. A variety of devices and methods for supplying and delivering the energy to the plasma and for monitoring the voltage and current may be utilized. By determining changes in the state of the plasma quickly and accurately, embodiments of the present invention can lead to better process control.

It will, of course, be understood that many modifications of the present invention, in its various aspects, will be apparent to those skilled in the art. Other embodiments are possible, their specific features depending upon the particular application. For example, a variety of plasma chamber configurations may be employed in addition to those discussed above. In addition, other types of circuitry and measuring devices could be utilized. Therefore, the scope of the invention should not be limited by the particular embodiments herein described.

What is claimed:

1. A method for monitoring a plasma etching operation, comprising:
   monitoring a voltage of an RF signal;
   monitoring a current of the RF signal;
   determining when a voltage change occurs;
   determining when a current change occurs; and
   determining the end point of a plasma etching operation by comparing when the voltage changes with when the current change occurs.

2. A method as in claim 1, wherein said end point is determined on the basis of the first to change of the voltage and the current.

3. A method as in claim 1, wherein said end point is determined on the basis of the second to change of the voltage and the current.

4. A method for monitoring a plasma etching operation, comprising:
   monitoring a voltage of an RF signal;
   monitoring a current of the RF signal;
   determining when a voltage change occurs;
   determining when a current change occurs; and
   measuring emission intensity signals from the plasma using emission spectrometry and comparing the emission intensity signals with known values to determine when an end point of the plasma etching operation based on emission intensity signals occurs.

5. A method as in claim 3, further comprising comparing the end point of the plasma etching operation based on emission intensity signals with an additional end point determined on the basis of the first to change of the voltage and the current.

6. A method as in claim 4, further comprising comparing the end point of the plasma etching operation based on emission intensity signals with an additional end point determined on the basis of the second to change of the voltage and the current.

7. A plasma etching apparatus using a radiofrequency wave comprising:
   a radiofrequency generating means for generating the radiofrequency wave;
   an electrode provided at a position for generating a plasma;
   a radiofrequency propagation means for propagating the radiofrequency wave generated in the radiofrequency generating means;
   a radiofrequency voltage measuring means provided in the radiofrequency propagation means for measuring the voltage of the radiofrequency wave propagating through the radiofrequency propagation means;
   a radiofrequency current measuring means provided in the radiofrequency propagation means for measuring the current of the radiofrequency wave propagating through the radiofrequency propagation means; and
   a determination means for determining the end point of the plasma etching on the basis of the voltage and the current, wherein the determination means determines the end point of the plasma etching on the basis of the first to change of the voltage and current.

8. A plasma etching apparatus according to claim 6, wherein an electric device between measuring means, including the radiofrequency voltage measuring means and the radiofrequency current measuring means, and the electrode, consists of only the radiofrequency propagation means.

9. A plasma etching apparatus according to claim 6, wherein the radiofrequency current measuring means measures a current flowing in a coil wound around the radiofrequency propagation means.

10. A plasma etching apparatus comprising:
    an RF generator;
    a plasma formation region between an anode and a cathode;
    a lead line for transmitting an RF signal from the RF generator to the cathode;
    a voltage measurement device;
    a current measurement device; and
    wherein said voltage measurement device and said current measurement device are part of an RF probe, wherein the RF probe comprises a coil surrounding a portion of the lead line for measuring the current and a circuit coupled to the lead line for measuring the voltage.

11. A plasma etching apparatus as in claim 10, further comprising:
    an ammeter coupled to the coil;
    a circuit coupled to the lead line; and
    a voltmeter coupled to the circuit.

12. A plasma etching apparatus as in claim 10, further comprising an RF matching network and a blocking capacitor coupled to the lead line, wherein the apparatus is arranged so that an RF signal travels from the RF generator through the RF matching network, the blocking capacitor, the RF probe and the cathode.

13. A plasma etching apparatus using a radiofrequency wave comprising:

a radiofrequency generating means for generating the radiofrequency wave;

an electrode provided at a position for generating a plasma;

a radiofrequency propagation means for propagating the radiofrequency wave generated in the radiofrequency generating means;

a radiofrequency voltage measuring means provided in the radiofrequency propagation means for measuring the voltage of the radiofrequency wave propagating through the radiofrequency propagation means;

a radiofrequency current measuring means provided in the radiofrequency propagation means for measuring the current of the radiofrequency wave propagating through the radiofrequency propagation means; and a determination means for determining the end point of the plasma etching on the basis of the voltage and the current;

wherein the radiofrequency current measuring means measures a current flowing in a coil wound around the radiofrequency propagation means.

14. A method for detecting the end point of plasma etching using a radiofrequency wave comprising:

measuring a voltage and a current of the radiofrequency wave, and determining the end point of the plasma etching on the basis of the voltage and the current, wherein the end point of the plasma etching is determined on the basis of a determination of the first to change of the voltage and the current.

15. A plasma etching apparatus comprising:

an RF generator;

a plasma formation region between an anode and a cathode;

a voltage measurement device;

a current measurement device;

a plasma emission spectrometry device; and a comparison device for comparing a first etching end point determined from plasma emission data obtained from the plasma emission device with a second etching end point determined from voltage and current measurements obtained from the voltage measurement device and the current measurement device.

* * * * *